(12) United States Patent
Lima Sarabanda et al.

(10) Patent No.: US 11,162,586 B2
(45) Date of Patent: Nov. 2, 2021

(54) PISTON RING AND METHOD OF MANUFACTURE

(71) Applicant: MAHLE International GmbH, Stuttgart (DE)

(72) Inventors: Jose Valentim Lima Sarabanda, Sao Paulo (BR); Fabio Mendes de Araujo, Waterford, MI (US); Gisela Ablas Marques, SP (BR)

(73) Assignee: Mahle International GmbH

( * ) Notice: Subject to any disclaimer, the term of this patent is extended or adjusted under 35 U.S.C. 154(b) by 180 days.

(21) Appl. No.: 16/205,549

(22) Filed: Nov. 30, 2018

(65) Prior Publication Data

US 2019/0093769 A1 Mar. 28, 2019

Related U.S. Application Data

(63) Continuation-in-part of application No. 15/612,062, filed on Jun. 2, 2017.

(51) Int. Cl.
*F16J 9/26* (2006.01)
*C23C 14/06* (2006.01)
*C23C 14/02* (2006.01)

(52) U.S. Cl.
CPC ............ *F16J 9/26* (2013.01); *C23C 14/024* (2013.01); *C23C 14/0641* (2013.01)

(58) Field of Classification Search
CPC ........ F16J 9/26; C23C 14/024; C23C 14/0641
See application file for complete search history.

(56) References Cited

U.S. PATENT DOCUMENTS

| 2,873,154 | A | | 2/1959 | Marker |
| 3,770,286 | A | * | 11/1973 | Angilella ............... C25D 5/14 277/444 |
| 5,316,321 | A | | 5/1994 | Ishida et al. |

(Continued)

FOREIGN PATENT DOCUMENTS

| CN | 1225160 A | 8/1999 |
| CN | 201050596 Y | 4/2008 |

(Continued)

OTHER PUBLICATIONS

Chinese Office Action dated May 26, 2020 for copending Chinese Appl. No. 201880035613.5.

(Continued)

*Primary Examiner* — Vishal A Patel
(74) *Attorney, Agent, or Firm* — Fishman Stewart PLLC

(57) ABSTRACT

A piston ring and a method of manufacturing a piston ring for a piston of a reciprocating internal combustion engine. The piston ring comprises a body having an outer circumferential surface. A tribological coating is formed on the outer circumferential surface of the body. The tribological coating has a dual layer or a triple layer structure and includes a relatively hard base layer and a relatively porous top layer overlying the base layer. The tribological coating may be provided with varying thickness such that its thickness increases gradually from 90° towards 0° in a first radial direction of the piston ring and from 270° towards 360° in a second radial direction of the piston ring reaching its maximum value in the region of 0° and 360°, i.e. the tips of the piston ring.

21 Claims, 4 Drawing Sheets

(56) References Cited

U.S. PATENT DOCUMENTS

| | | |
|---|---|---|
| 5,582,414 A | 12/1996 | Miyazaki et al. |
| 7,052,019 B2 | 5/2006 | Miida |
| 7,833,636 B2 | 11/2010 | kraujo et al. |
| 7,891,669 B2 | 2/2011 | kraujo et al. |
| 8,273,469 B2 | 9/2012 | Hoppe et al. |
| 9,488,275 B2 | 11/2016 | Ivanov et al. |
| 9,506,138 B2 | 11/2016 | Sugiura |
| 10,724,637 B2 | 7/2020 | Da Rocha Mordente |
| 2006/0269790 A1 | 11/2006 | Sarabanda et al. |
| 2008/0095939 A1 | 4/2008 | Fischer et al. |
| 2010/0117304 A1* | 5/2010 | Esser ................ F16J 9/14 277/443 |
| 2012/0205875 A1 | 4/2012 | Kennedy et al. |
| 2012/0126488 A1 | 5/2012 | Avelar Ara jo |
| 2013/0307221 A1* | 11/2013 | Esser ................ F16J 9/14 277/434 |
| 2014/0217677 A1 | 8/2014 | Smith et al. |
| 2015/0211635 A1* | 7/2015 | Wu ................ C23C 14/0021 277/443 |
| 2016/0084380 A1 | 3/2016 | Da Rocha Mordente et al. |
| 2016/0122862 A1* | 5/2016 | Lammers ............ C23C 14/0641 277/443 |

FOREIGN PATENT DOCUMENTS

| | | | |
|---|---|---|---|
| EP | 0764801 | 3/1997 | |
| GB | 2243162 | 10/1991 | |
| GB | 2314604 | 1/1998 | |
| RU | 2110693 C1 * | 5/1998 | |
| WO | WO-2014194874 A1 * | 12/2014 | ................ F16J 9/28 |
| WO | WO-2016055498 A1 * | 4/2016 | ............ C23C 14/044 |

OTHER PUBLICATIONS

English Abstract for CN1225160.
English Abstract for CN201050596.
U.S. Appl. No. 15/612,062, filed Jun. 2, 2017, US-2018/0347696, pending.

* cited by examiner

PISTON RING AND METHOD OF MANUFACTURE

CROSS-REFERENCE TO RELATED APPLICATIONS

The present application is a continuation-in-part of and claims the benefit of and priority to U.S. application Ser. No. 15/612,062, filed Jun. 2, 2017, the contents of which as are hereby incorporated by reference herein in their entirety.

BACKGROUND

Related Field

The present disclosure generally relates to a piston ring for a piston of a reciprocating engine, and more particularly, to a coating for a piston ring.

Related Art

A piston ring is an open-ended ring that fits into an annular groove formed in an outer circumference of a piston of a reciprocating engine, such as an internal combustion engine. A typical piston is equipped with multiple piston rings, including a top compression ring, an oil control ring, and a scraper ring. Many piston rings are constructed with a larger relaxed diameter than that of the cylinder in which they will be disposed. When disposed within a cylinder of the engine, the piston rings are compressed around the piston due to their intrinsic spring force, which ensures sufficient radial contact between the rings and an inner wall of the cylinder. During engine operation, the piston moves up and down within the cylinder and the radial pressure exerted on the cylinder wall by the piston rings provides a seal around the piston that isolates the combustion chamber from the crankcase. Gas pressure from the combustion chamber may increase the sealing capability of the piston rings by forcing the rings outward and increasing the radial contact pressure between the piston rings and the cylinder wall.

An effective gas-tight seal between the piston and the inner wall of the cylinder is necessary for efficient engine operation and is the primary responsibility of compression-type piston rings. Compression rings are located closest to the combustion chamber and help prevent a phenomenon known as "blow-by," wherein combustion gases leak from the combustion chamber, past the piston rings, into the crankcase. In addition, compression rings also help control oil consumption by preventing excess oil not needed for lubrication from traveling in the opposite direction from the crankcase into the combustion chamber. To obtain an effective seal between the combustion chamber and the crankcase, compression rings must constantly and fully contact the inner wall of the cylinder. However, due to manufacturing tolerances and the thermal and mechanical loads imparted on the engine, the shape of the rings may not always match that of the cylinder in which they are disposed.

After initial assembly of a new "green" engine, the piston rings may not perfectly conform to the shape of the cylinder in which they are disposed. In such case, the piston rings must undergo a break-in or running-in phase wherein the rings are seated to the cylinder wall by being physically worn into the cylinder wall until an effective gas-tight seal is established therebetween. During this initial break-in period, combustion gas blow-by and excess oil consumption by the engine may occur due to gaps or local variations in the contact pressure between the piston rings and the cylinder wall. Accordingly, it is desirable to reduce the duration of the initial break-in phase so that the engine reaches its optimum operating efficiency as quickly as possible.

Some methods of improving engine break-in performance have involved applying sacrificial or abradable coatings to the mating or contact surfaces of sliding components. These sacrificial coatings are designed to be easily worn away where necessary during initial engine operation so that the contact profiles of the sliding components rapidly conform to each other, leaving little or no clearance there-between. In order to achieve a desired level of abradability, such coatings are oftentimes made of polymeric materials and/or dry lubricants which can be readily worn away and/or transferred from one contact surface to another. However, the abraded portions of these polymeric materials and/or dry lubricants may contaminate the operating environment of the engine and/or may mar the contact surfaces of the sliding components. Therefore, there remains a need in the art for an improved method of enhancing engine break-in performance.

BRIEF SUMMARY

A piston ring comprising a body having an outer circumferential surface is provided. A tribological coating is formed on the outer circumferential surface of the body. The tribological coating includes a base layer and a top layer overlying the base layer. The top layer may comprise a transition metal nitride-based material, wherein the transition metal may be selected from the group consisting of titanium (Ti), zirconium (Zr), vanadium (V), niobium (Nb), chromium (Cr), molybdenum (Mo), tungsten (W), and combinations thereof. The top layer may have a relatively high porosity and a relatively low Vickers hardness, as compared to the porosity and Vickers hardness of the base layer. In another form, the top layer may comprise a chromium nitride (CrN)-based material or a hydrogen-free diamond-like carbon (DLC)-based material, both with reduced hardness.

In one form, the base layer of the tribological coating may comprise a transition metal nitride-based material, and the transition metal may be selected from the group consisting of titanium (Ti), zirconium (Zr), vanadium (V), niobium (Nb), chromium (Cr), molybdenum (Mo), tungsten (W), and combinations thereof. In another form, the base layer may comprise a diamond-like carbon (DLC)-based material. In a third form, the base layer may comprise a chromium nitride (CrN)-based material, a chromium oxynitride (CrON)-based material, a chromium carbon-nitride (CrCN/C)-based material or a multilayer structure intercalating one layer of a chromium nitride (CrN)-based material and one layer of a chromium aluminum nitride (CrAlN)-based material.

The top layer of the tribological coating may define a cylinder wall engaging surface of the piston ring and may have a contour that exhibits a plurality of valleys and ridges.

The tribological coating may also have an intermediate layer formed between the base layer and the top layer. The intermediate layer may comprise a transition metal nitride-based material, and the transition metal may be selected from the group consisting of titanium (Ti), zirconium (Zr), vanadium (V), niobium (Nb), chromium (Cr), molybdenum (Mo), tungsten (W), and combinations thereof. In another form, the intermediate layer may comprise a chromium oxynitride (CrON)-based material, a chromium carbon-nitride (CrCN/C)-based material or a multilayer structure intercalating one layer of a chromium nitride (CrN)-based material and one layer of a chromium aluminum nitride (CrAlN)-based material.

The base layer and/or the intermediate layer may be provided with varying thickness such that their thickness increases gradually from 90° towards 0° in a first radial direction of the piston ring and from 270° towards 360° in a second radial direction of the piston ring reaching a maximum value in the region of 0° and 360°, i.e. the tips of the piston ring. As a result, the base layer and/or the intermediate layer may be thickest adjacent the tips of the piston ring, while the same layers may be thinnest radially opposite the tips of the piston ring.

A nitrided layer may be formed at an exterior surface of the body and an intermediate coating may be deposited on the exterior surface of the body, between the nitrided layer and the tribological coating. The tribological coating may be deposited on the outer circumferential surface of the piston ring by a physical vapor deposition (PVD) process. At least one process parameter of the physical vapor deposition process may be modified partway through the deposition process such that the top layer of the tribological coating exhibits a relatively high porosity and a relatively low Vickers hardness, as compared to that of the underlying base layer.

It can also be provided a PVD process of three subsequent steps, in which: i) the first step is capable of depositing a coating layer of uniform thickness over the entire outer circumferential surface of the piston ring, i.e. over 360°; ii) the second step is capable of depositing a coating layer of increased thickness in the region of the piston ring tips, i.e. from 270° towards 360° and from 90° towards 0°; iii) the third step is capable of depositing a coating of uniform thickness over the entire outer circumferential surface of the piston ring, i.e. over 360°.

The piston ring, as described above, may be used in combination with a piston and disposed within a cylinder of a reciprocating internal combustion engine to form a seal around the piston between the combustion chamber and the crankcase.

DETAILED DESCRIPTION

The presently disclosed tribological coating may be formed on a contact surface of a sliding component, such as a piston ring for a piston of a reciprocating internal combustion engine. When the tribological coating is formed on an outer circumferential surface of a piston ring, such as an upper compression ring, the tribological coating may provide the piston ring with superior short-term and long-term performance, as compared to prior art piston rings. For example, the presently disclosed tribological coating may allow an effective gas-tight seal to be formed around a piston in a relatively short amount of time, which may help stabilize engine performance by reducing combustion gas blow-by and excess oil consumption. In addition, the tribological coating may provide the piston ring with excellent high temperature wear resistance, hardness, and low frictional resistance throughout the life of the piston ring.

Figure 1:
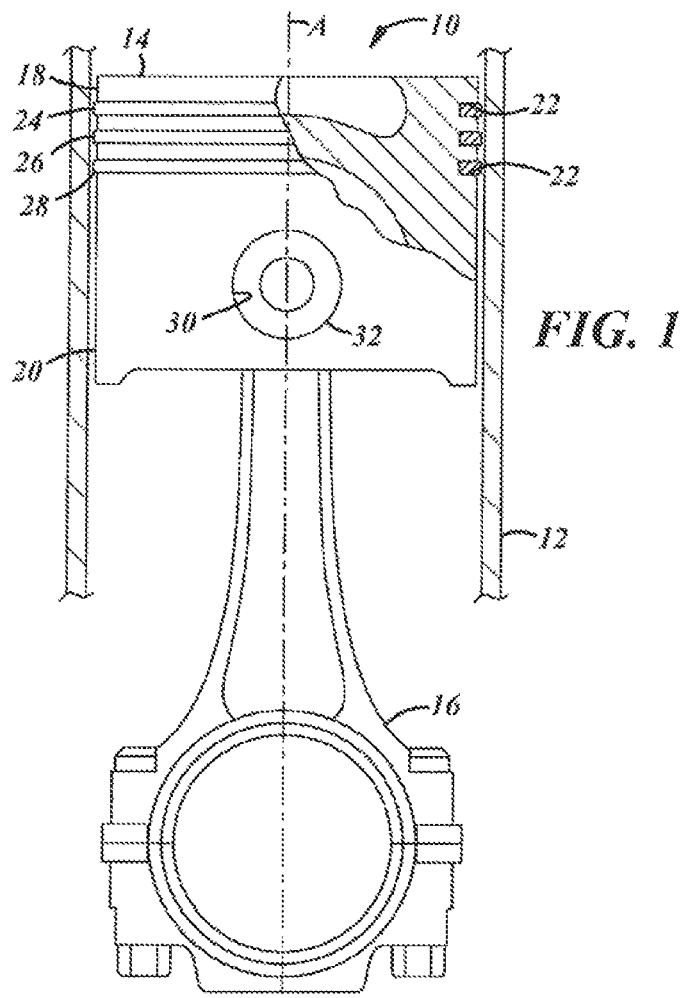
FIG. 1 is a schematic side elevation of a piston and connecting rod assembly for a reciprocating internal combustion engine.

FIG. 1 illustrates a piston and connecting rod assembly 10 for use in a cylinder 12 of a reciprocating internal combustion engine (not shown). The assembly 10 has a central longitudinal axis A and comprises a piston 14 and a connecting rod 16. When disposed within the cylinder 12, a combustion chamber (not shown) is typically located immediately above an upper surface of the piston 14 and a lubricating oil containing crankcase (not shown) is typically located below a lower surface of the piston 14.

The piston 14 has a body including an upper crown 18 and a lower skirt 20. A plurality of annular grooves 22 are formed about an outer circumference of the crown 18 of the piston 14 and are sized to accommodate piston rings, e.g., an upper compression ring 24, a lower compression ring 26, and an oil control ring 28. Each of the piston rings 24, 26, 28 has a cylinder wall engaging surface or contact surface on an outer circumference thereof that is adapted to contact and slide along an inner wall of the cylinder 12. A pin bore 30 is formed in the skirt 20 of the piston 14 and is sized to receive a piston pin 32 for connecting the piston 14 to a small end of the connecting rod 16.

Figure 2:
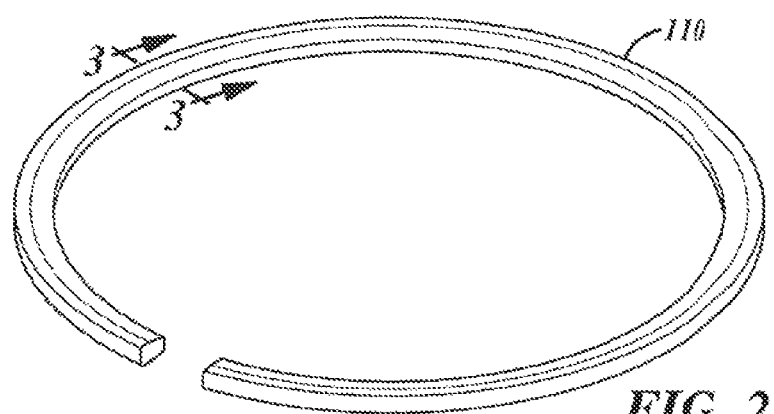
FIG. 2 is a schematic perspective view of a piston ring.
Figure 3:
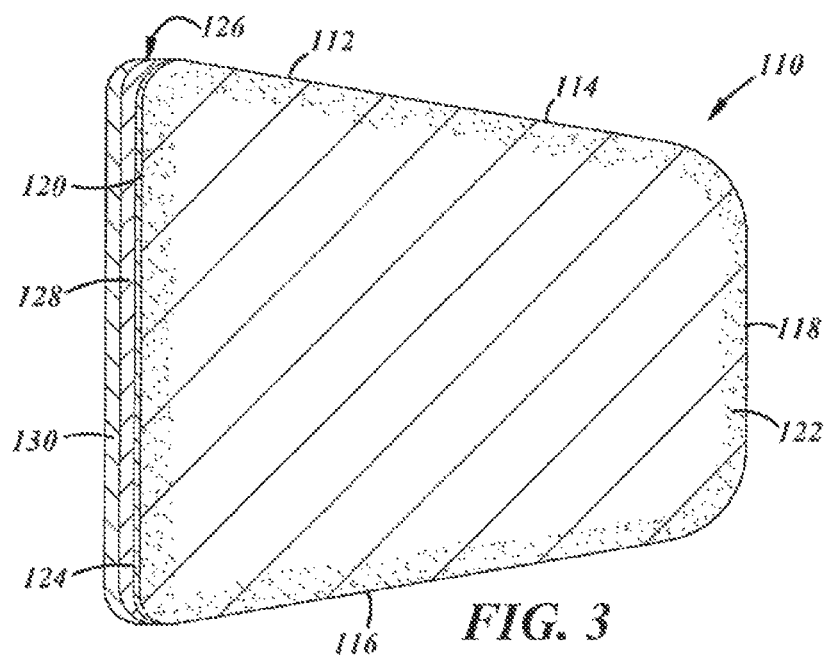
FIG. 3 is a schematic cross-sectional view of the piston ring of FIG. 2 taken along line 3-3.

FIGS. 2 and 3 illustrate a piston ring 110 for a piston of a reciprocating internal combustion engine, such as the piston 14 illustrated in FIG. 1. The piston ring 110 comprises a split annular body 112 having an exterior surface that includes an upper surface 114, a lower surface 116, an inner circumferential surface 118, and an outer circumferential surface 120 extending between the upper and lower surfaces 114, 116. In cross-section, the piston ring 110 illustrated in FIGS. 2 and 3 has a keystone shape, with tapered upper and lower surfaces 114, 116. However, the piston ring 110 may exhibit various other cross-sectional shapes, e.g., rectangular. In addition, the cross-sectional profile of the outer circumferential surface 120 of the piston ring 110 may be generally straight, as illustrated in FIGS. 2 and 3, or it may follow an angled or arch-shaped path between the upper and lower surfaces 114, 116. The annular body 112 may be made of cast iron (e.g., gray or nodular cast iron), steel (e.g., stainless steel), or any other suitable ferrous metal or alloy. The material of the annular body 112 may be selected based upon the application and desired performance characteristics of the piston ring 110, and/or upon the composition of any overlying coating layers.

A diffusion nitrided layer 122 may be formed at the exterior surface of the annular body 112, although this is not necessarily required. The nitrided layer 122 may be formed by any known nitriding process. For example, the nitrided layer 122 may be formed by heating the annular body 112 to a suitable temperature and exposing the annular body 112 to a nitrogen-containing gas, e.g., ammonia ($NH_3$). The nitrided layer 122 may extend from the exterior surface of the annular body 112 of the piston ring 110 at a depth in the range of 10-170 The actual depth of the nitrided layer 122 at the exterior surface of the body 112 may be selected based upon the size of the piston ring 110 and also may be selected to impart certain desirable mechanical and/or physical properties to the piston ring 110, including high hardness, wear resistance, scuff resistance, and improved fatigue life. Alternatively, the exterior surface of the annular body 112 may be subjected to a different type of thermochemical surface treatment process to produce a different type of diffusion layer at the exterior surface of the annular body 112. Other heat-treatment processes may additionally or alternatively be performed to increase the hardness of select surface portions of the annular body 112, including through hardening, hardening with isothermal quenching, and/or induction surface hardening. In some instances, depending on the composition of the annular body 112, additional surface treatment or hardening processes may not be performed.

Referring now to FIG. 3, in one form, an interlayer or intermediate coating 124 and a tribological coating 126 are formed on the exterior surface of the annular body 112 over the optional nitrided layer 122. The tribological coating 126 may be formed on the exterior surface of the annular body 112 over the intermediate coating 124 and/or over one or more other coating layers already present on the exterior surface of the annular body 112. Or the tribological coating 126 may be formed directly on the exterior surface of the annular body 112. In such case, the intermediate coating 124 is omitted. Forming the tribological coating 126 directly on the exterior surface of the annular body 112 may or may not include forming the tribological coating 126 over the nitrided layer 122 or some other type of diffusion layer. This will depend upon whether the annular body 112 has or has not been subjected to a nitriding process or some other type of thermochemical surface treatment or heat treatment process prior to deposition of the tribological coating 126.

In FIG. 3, the intermediate coating 124 and the tribological coating 126 are formed on the outer circumferential surface 120 of the annular body 112. In particular, the intermediate coating 124 and the tribological coating 126 are formed on the outer circumferential surface 120 of the annular body 112 such that the intermediate coating 124 and the tribological coating 126 both extend from the upper surface 114 to the lower surface 116 of the annular body 112. In other embodiments, the intermediate coating 124 and/or the tribological coating 126 may be additionally or alternatively formed over one or more other exterior surfaces of the annular body 112, including the upper surface 114, the lower surface 116, and/or the inner circumferential surface 118 of the body 112. In addition, in FIG. 3, the intermediate coating 124 is disposed between the nitrided layer 122 and the tribological coating 126 on the outer circumferential surface 120 of the annular body 112. However, in other embodiments, the intermediate coating 124 may be omitted and the tribological coating 126 may be formed directly on the outer circumferential surface 120 of the annular body 112.

The intermediate coating 124 may help improve adhesion of the tribological coating 126 to the exterior surface of the annular body 112 and may comprise at least one of chromium (Cr), nickel (Ni), cobalt (Co), titanium (Ti), and vanadium (V). In one form, the intermediate coating 124 may consist essentially of elemental chromium (Cr). The intermediate coating 124 may be formed on the exterior surface of the annular body 112 by a thermal spray process (e.g., a flame spraying process, a high velocity oxy-fuel (HVOF) process, or a plasma spraying process), a physical vapor deposition (PVD) process, or by any other suitable process. A suitable thickness for the intermediate coating 124 may be in the range of 1-10 μm, measured in the radial direction of the piston ring 110. However, in other forms, the thickness of the intermediate coating 124 may be somewhat more or less than this amount depending on the application method used to form the intermediate coating 124 on the exterior surface of the annular body 112.

The tribological coating 126 may have a dual layer structure, and may include a relatively hard base layer 128 and a relatively porous top layer 130. The physical and mechanical properties of the top layer 130 and the base layer 128 may be configured to provide the piston ring 110 with a combination of excellent short-term and long-term performance. For example, the physical and mechanical properties of the top layer 130 may be configured to provide the piston ring 110 with excellent performance during the initial break-in phase of the piston ring 110, and the base layer 128 may be configured to maintain the high temperature wear resistance and low frictional resistance of the piston ring 110 for an extended duration. More specifically, it has been found that excellent short-term and long-term performance of the piston ring 110 may be achieved by decreasing the hardness and increasing the porosity (or decreasing the density) of the top layer 130 of the tribological coating 126 relative to the hardness and porosity (or density) of the base layer 128. Increasing the porosity and decreasing the hardness of the top layer 130 may in turn reduce the internal stress of the top layer 130, relative to the internal stress of the base layer 128.

Without intending to be bound by theory, it is believed that the relatively low hardness of the top layer 130 may improve the break-in performance of the piston ring 110 by allowing the shape of the contact surface of the piston ring 110 to more readily conform to the shape of the inner wall of the cylinder 12 during initial engine operation so that the piston ring 110 may be seated to the inner wall of the cylinder 12 in a relatively short amount of time. At the same time, the relatively high hardness of the base layer 128 may provide the piston ring 110 with excellent long-term wear resistance.

The increased porosity (or decreased density) of the top layer 130 of the tribological coating 126, relative to the porosity of the base layer 128, may provide the contact surface of the piston ring 110 with a relatively rough contour.

More specifically, the surface of the top layer 130 of the tribological coating 126 may have a contour that exhibits a plurality of valleys and ridges or plateaus. Without intending to be bound by theory, it is believed that the valleys formed along the surface of the top layer 130 may allow the contact surface of the piston ring 110 to retain a significant amount of liquid lubricant (e.g., oil), which may help form a seal and reduce friction between the contact surface of the ring 110 and the inner wall of the cylinder 12 during engine operation. In addition, the retained lubricant on the contact surface of the piston ring 110 may reduce scuffing between the contact surface of the piston ring 110 and the inner wall of the cylinder 12 during initial engine operation, further enhancing the break-in performance of the piston ring 110. At the same time, the relatively high density of the base layer 128 may provide the piston ring 110 with a relatively smooth contact surface over time, which may provide the piston ring 110 with excellent long-term frictional behavior.

The ratio of the Vickers hardness of the top layer 130 to the Vickers hardness of the base layer 128 may be in the range of 0.5:1 to 0.7:1. The Vickers hardness or microhardness of the base layer 128 and top layer 130 may be measured according to ASTM E-384 using a 136° pyramidal diamond indenter on a polished cross section of the piston ring 110. In one form, the Vickers hardness of the top layer 130 may be greater than or equal to 800 HV, 900 HV, or 950 HV; less than or equal to 1200 HV, 1100 HV, or 1050 HV; or between 800-1200 HV, 900-1100 HV, or 950-1050 HV, and the Vickers hardness of the base layer 128 may be greater than or equal to 1300 HV, 1400 HV, or 1450 HV; less than or equal to 2500 HV, 1700 HV, 1600 HV, or 1550 HV; or between 1300-2500 HV, 1300-1700 HV, 1400-1600 HV, or 1450-1550 HV. The reduced internal stress of the top layer 130 may help reduce or eliminate cracking of the tribological coating 126.

In one form, the base layer 128 and the top layer 130 may comprise one or more Group 4, 5, and/or 6 transition metal nitrides. For example, the base layer 128 and the top layer 130 may comprise nitrides of titanium (Ti), zirconium (Zr), vanadium (V), niobium (Nb), chromium (Cr), molybdenum (Mo), and/or tungsten (W). In one specific example, both the base layer 128 and the top layer 130 may comprise a chromium nitride (Cr—N)-based material, as such material may provide the piston ring 110 with excellent wear resistance and low frictional resistance between the contact surface 120 of the piston ring 110 and the inner wall of the cylinder 12. The term "chromium nitride-based material," as used herein, broadly includes any material or alloy where chromium (Cr) and nitrogen (N) are the predominant constituents of the material, based upon the overall weight of the material. This may include materials having greater than 50 wt % chromium nitride, as well as those having less than 50 wt % chromium nitride, so long as chromium (Cr) and nitrogen (N) are the two largest constituents of the material. In one form, the overall composition of the tribological coating 126 may include 40-70 at % chromium (Cr) and 30-60 at % nitrogen (N). In one form, the chromium nitride-based material may consist essentially of stoichiometric ratios of chromium nitride (e.g., CrN and/or $Cr_2N$) and may include a mixture of CrN and $Cr_2N$.

The chemical composition of the base layer 128 may be the same or different from that of the top layer 130. For example, in one form, the top layer 130 may comprise a chromium nitride-based material and the base layer 128 may comprise an amorphous carbon or diamond-like carbon (DLC)-based material. In such case, the base layer 128 may have a Vickers hardness in the range of 1800-2500 HV and the ratio of the Vickers hardness of the top layer 130 to the Vickers hardness of the base layer 128 may be in the range of 0.2:1 to 0.6:1.

In a second preferred embodiment, the base layer 128 may comprise a chromium oxynitride (CrON)-based material, as such material provides grain size reduction due to the addition of oxygen, increasing the coating tenacity and providing strong obstacles against fatigue crack propagation. CrON also provides excellent wear and spalling resistance. The Vickers hardness of the base layer 128 comprising CrON may be greater than or equal to 1600 HV; less than or equal to 2000 HV; or between 1600 and 2000 HV. The above-described ranges of Vickers hardness are exemplary and non-limiting in nature; it should be understood that in certain embodiments the Vickers hardness may be approximately 1600 HV or approximately 2000 HV.

In another form, the base layer 128 may comprise a chromium carbon-nitride (CrCN/C)-based material, in which carbon is provided in the form of solid solution and in the form of free carbon. Such material increases the coating hardness and, as a consequence, provides better wear resistance. In addition to that, the free carbon functions as a solid lubricant reducing friction against the cylinder 12 inner wall. The Vickers hardness of the base layer 128 comprising CrCN/C may be greater than or equal to 1800 HV; less than or equal to 2200 HV; or between 1800 and 2200 HV.

In still another form, the base layer 128 may comprise a multilayer structure intercalating one layer of a chromium nitride (CrN)-based material and one layer of a chromium aluminum nitride (CrAlN)-based material, which provides obstacles against fatigue crack propagation, increasing spalling resistance. Additionally, the presence of aluminum may mitigate coating oxidation during engine operation. The Vickers hardness of the base layer 128 comprising CrN/CrAlN multilayer structure may be greater than or equal to 1900 HV; less than or equal to 2500 HV; or between 1900 and 2500 HV. It is important to observe that this multilayer structure also generates coating hardening when compared to monolayer structures.

In the second preferred embodiment, the top layer 130 may comprise a chromium nitride (CrN)-based material or a hydrogen-free diamond-like carbon (DLC)-based material, both with reduced hardness. Low hardness CrN provides higher spalling resistance due to reduced internal stress. The Vickers hardness of the top layer 130 comprising low hardness CrN may be greater than or equal to 800 HV; less than or equal to 1200 HV; or between 800 and 1200 HV. Low hardness hydrogen-free DLC reduces friction against the cylinder 12 inner wall during running-in phase and rapidly conforms the piston ring to the shape of the cylinder 12 inner wall resulting in more balanced blow-by during running-in. The Vickers hardness of the top layer 130 comprising low hardness hydrogen-free DLC may be greater than or equal to 1000 HV; less than or equal to 2000 HV; or between 1000 and 2000 HV.

In a third preferred embodiment, the tribological coating may also have an intermediate layer 129 provided between the base layer 128 and the top layer 130. In the third preferred embodiment, the base layer 128 may comprise a chromium nitride (CrN)-based material with a Vickers hardness greater than or equal to 1200 HV; less than or equal to 1600 HV; or between 1200 and 1600 HV and the top layer 130 may comprise a chromium nitride (CrN)-based material but with a Vickers hardness greater than or equal to 800 HV; less than or equal to 1200 HV; or between 800 and 1200 HV. The Vickers hardness of the top layer 130 must be lower than the Vickers hardness of the base layer 128.

In the third preferred embodiment, the intermediate layer 129 may comprise one or more Group 4, 5, and/or 6 transition metal nitrides. For example, the intermediate layer 129 may comprise nitrides of titanium (Ti), zirconium (Zr), vanadium (V), niobium (Nb), chromium (Cr), molybdenum (Mo), tungsten (W) and combinations thereof. In another form, the intermediate layer 129 may comprise a chromium oxynitride (CrON)-based material with a Vickers hardness greater than or equal to 1600 HV; less than or equal to 2000 HV; or between 1600 and 2000 HV; or the intermediate layer 129 may comprise a chromium carbon-nitride (CrCN/C)-based material with a Vickers hardness greater than or equal to 1800 HV; less than or equal to 2200 HV; or between 1800 and 2200 HV; or the intermediate layer 129 may comprise a multilayer structure which intercalates one layer of a chromium nitride (CrN)-based material and one layer of a chromium aluminum nitride (CrAlN)-based material with a Vickers hardness greater than or equal to 1900 HV; less than or equal to 2500 HV; or between 1900 and 2500 HV.

The top layer 130 of the tribological coating 126 is distinguishable from prior sacrificial or abradable coatings, which are typically made of polymeric materials and/or dry lubricants and are designed to be readily worn away and easily transferred from one contact surface to another. As such, the top layer 130 of the tribological coating 126 preferably does not include any polymeric materials or dry lubricants. As used herein, the term "polymeric material" means any material that comprises or contains a polymer and may include composite materials that include a combination of a polymer and a non-polymeric material. The term "polymer" is used in its broad sense to denote both homopolymers and heteropolymers. Homopolymers are made of a single type of polymer, while heteropolymers (also known as copolymers) are made of two (or more) different types of monomers. Some examples of polymeric materials that are preferably absent from the tribological coating 126 include: acetals; acrylics; acrylonitrile-butadiene-styrene; alkyds; diallyl phthalate; epoxy; fluorocarbons; melamine-formaldehyde; nitrile resins; phenolics; polyamides; polyamide-imide; poly(aryl ether); polycarbonate; polyesters; polyimides; polymethylpentene; polyolefins, including polyethylene and polypropylene; polyphenylene oxide; polyphenylene sulfide; polyurethanes; silicones; styrenics; sulfones; block copolymers; urea-formaldehyde; and vinyls. Some examples of dry lubricants that are preferably absent from the tribological coating 126 include: graphite, molybdemum disulfide ($MoS_2$), tungsten disulfide ($WS_2$), silicates, fluorides, clays, titanium oxides, boron nitride, and talc.

The tribological coating 126 may have an overall thickness in the range of about 5-100 μm, measured in the radial direction of the piston ring 110. For example, the overall thickness of the tribological coating 126 may be greater than or equal to 20 μm, 30 μm, or 40 μm; less than or equal to 100 μm, 80 μm, or 60 μm; or between 20-100 μm, 30-80 μm, or 40-60 μm. The overall thickness of the tribological coating 126 may be somewhat more or less than these amounts depending on the particular application of use. The thickness of the top layer 130 may be less than that of the base layer 128 and may account for approximately 5% to 50% of the overall thickness of the tribological coating 126, or approximately 5% to 30% of the overall thickness of the tribological coating 126. The thickness of the top layer 130 may be greater than or equal to 5 μm, 8 μm, or 11 μm; less than or equal to 25 μm, 20 μm, or 16 μm; or between 5-25 μm, 8-20 μm, or 11-16 μm, and the thickness of the base layer 128 may be greater than or equal to 25 μm, 30 μm, or 32 μm; less than or equal to 50 μm, 40 μm, or 35 μm; or between 25-50 μm, 30-40 μm, or 32-35 μm. The ratio of the thickness of the top layer 130 to the thickness of the base layer 128 may vary depending on the application of the piston ring 110 and the operating parameters of the engine.

Figure 5:
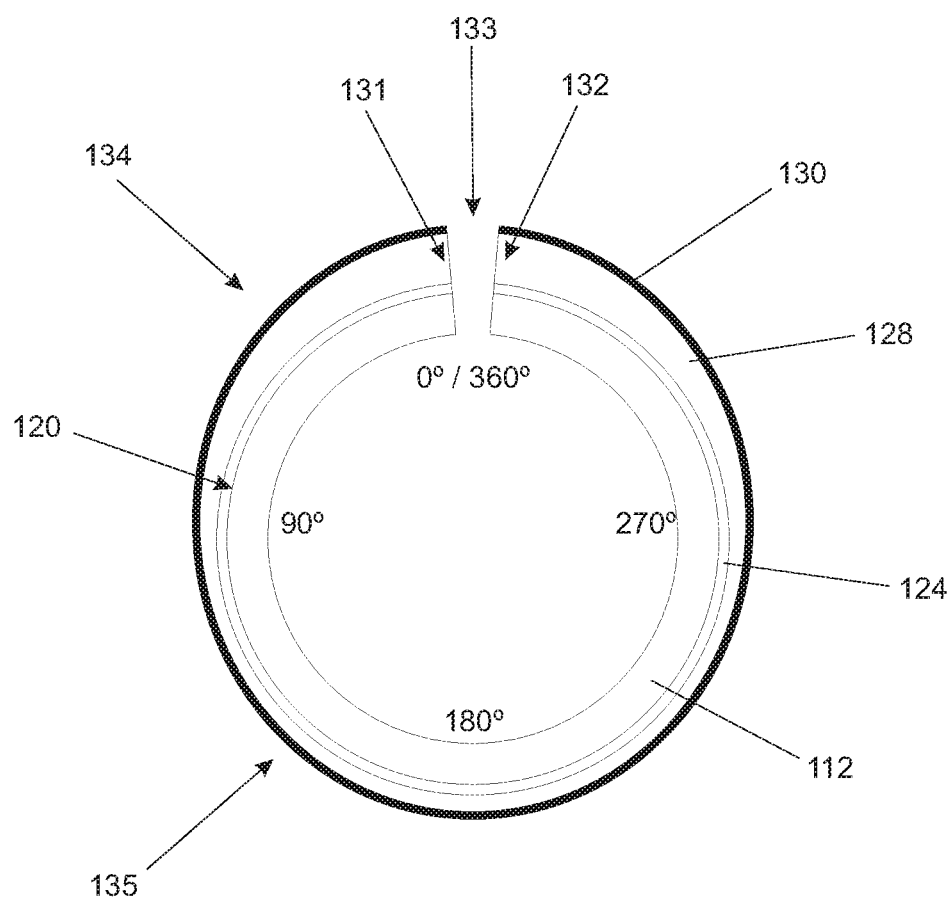
FIG. 5 is a schematic top view of a piston ring in a first possible configuration of the tribological coating.

Referring now to FIG. 5, in the second preferred embodiment, the tribological coating 126 may have variable thickness such that the base layer 128 is thicker in the region of the tips of the piston ring 110 to increase durability and avoid base material exposure at the tips.

In other words, the top layer 130 may in certain embodiments have a uniform thickness while the base layer 128 is provided with varying thickness such that its thickness increases gradually from 90° towards 0° in a first radial direction of the piston ring 110 and from 270° towards 360° in a second radial direction of the piston ring 110 reaching its maximum value in the region of the ends 131,132 of the piston ring 110 open-ended portion 133. In such embodiments it should be understood that the 0° and the 360° regions of the piston ring 110 are those substantially adjacent the tips of the piston ring, as described immediately below and elsewhere herein. As a result, the base layer may be thickest adjacent the tips of the piston ring, while the same layers may be thinnest radially opposite the tips of the piston ring. In at least one embodiment, the variance in thickness of the base layer is a constant value between the tips of the piston ring and the region opposite the tips.

The piston ring 110 is provided with an open-ended portion 133 which fits into an annular groove formed in an outer circumference of a piston of a reciprocating engine. The region of the open-ended portion 133 (i.e., opening) is defined by two ends 131, 132 which form the tips of the piston ring 110. The center of the open-ended portion 133 is defined as a zero-degree (0°) angle and a 360° angle and each end 131, 132 or tip of the piston ring is positioned at about 5° from the center, i.e. 0° and 360°, of the open-ended portion 133. It should be understood that, in certain embodiments, the ends 131, 132 may be positioned slightly less than or greater than 5° from the center of the open-ended portion 133 or opening.

As may be seen in FIG. 5, the portion of the outer circumferential surface 120 of the piston ring 110 defined from 0° to 90° and from 270° to 360° has variable thickness which increases towards 0° and 360°. It may be understood that portion of the outer circumferential surface 120 in which the base layer 128 is thicker corresponds to the 90° adjacent on both sides of the center of the open-ended portion 133, which is henceforth referenced as a first half 134 of the piston ring 110. The opposite portion, i.e. from 90° to 270°, is henceforth referenced as a second half 135. According to various embodiments the variable thickness is maximum adjacent the tips of the piston ring and minimum opposite the same. In certain embodiments, the thickness varies in a constant fashion between the tips and the opposing side of the piston ring.

In the second preferred embodiment, the tribological coating 126 may have an overall thickness in the range of about 8-120 μm, measured in the radial direction of the piston ring 110. For example, the overall thickness of the tribological coating 126 applied to the second half 135 of the piston ring 110 is substantially uniform and may be greater than or equal to 8 μm, 10 μm, 12 μm; less than or equal to 40 μm, 45 μm, 50 μm; or between 8-40 μm, 10-45 μm, or 12-50 μm. The thickness of the tribological coating 126 applied to the first half 134 of the piston ring 110 varies from 270° towards 360° and from 90° towards 0° so that the ends 131, 132 of the piston ring 110 may have an overall thickness up to two times greater than the thickness of the adjacent portions of the ends 131, 132, i.e. out of the tips of the piston ring 110, the thickness of the ends 131, 132 ranging from 20 μm up to a maximum of 40 μm, or ranging from 10 μm up to a maximum of 80 μm.

In the second preferred embodiment, the top layer 130 may have a thickness in the range of 2-20 μm and the base layer 128 may have a thickness in the range of 6-100 μm, the thickness of the top layer 130 being smaller than the thickness of the base layer 128. The ends 131, 132 of the piston ring open-ended portion 133 have a thickness up to two times greater than the thickness of the adjacent portions out of the ends 131, 132 of the piston ring 110, the thickness of the ends 131, 132 ranging from 20 μm up to a maximum of 40 μm, or ranging from 10 μm up to a maximum of 80 μm.

Figure 6:
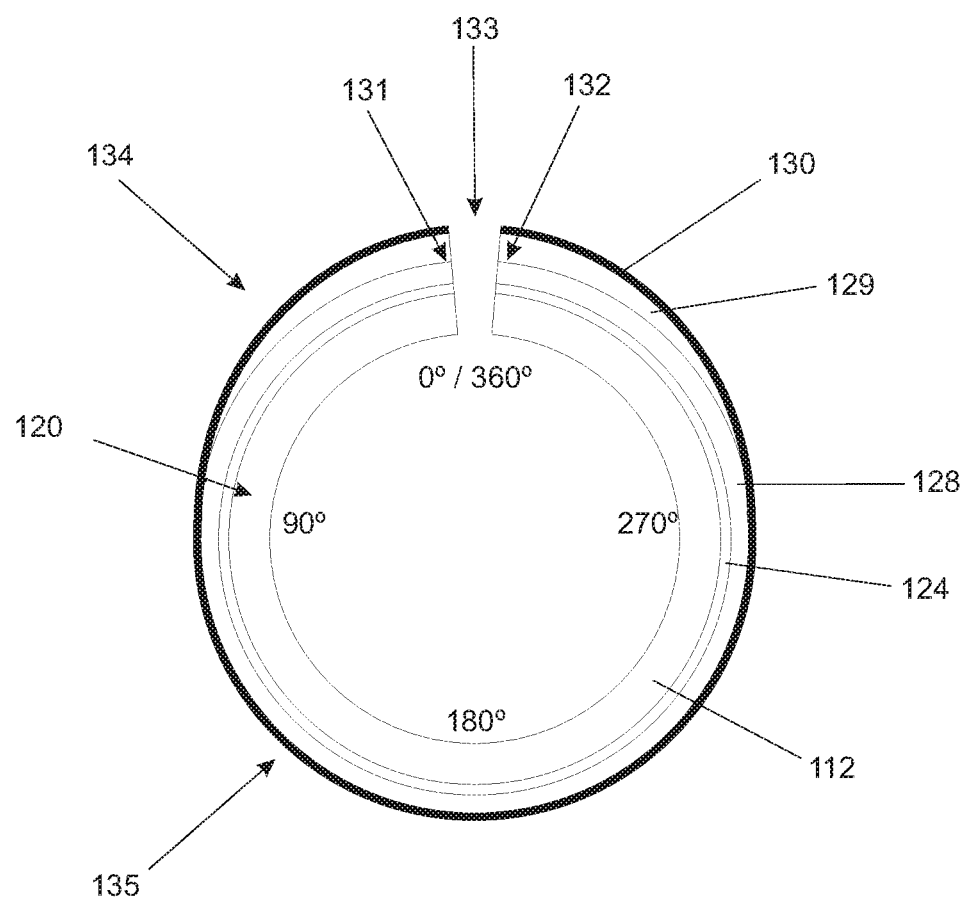
FIG. 6 is a schematic top view of a piston ring in a second possible configuration of the tribological coating.

Referring now to FIG. 6, in the third preferred embodiment, the tribological coating 126 may have variable thickness such that the intermediate layer 129 is thicker in the region of the tips of the piston ring 110 to increase durability and avoid base material exposure at the tips.

In other words, the base layer 128 and top layer 130 have a uniform thickness while the intermediate layer 129 provided between the base layer 128 and the top layer 130 have varying thickness such that its thickness increases gradually from 90° towards 0° in a first radial direction of the piston ring 110 and from 270° towards 360° in a second radial direction of the piston ring 110 reaching its maximum value in the region of the ends 131,132 of the piston ring 110 open-ended portion 133. In certain embodiments, the minimum thickness of the intermediate layer is provided radially opposite the region of the ends 131,132 of the piston ring open-ended portion 133.

In the third preferred embodiment, the tribological coating 126 may have an overall thickness in the range of about 15-120 μm, measured in the radial direction of the piston ring 110. For example, the overall thickness of the tribological coating 126 applied to the second half 135 of the piston ring 110 is substantially uniform and may be greater than or equal to 15 μm, 20 μm, 25 μm; less than or equal to 35 μm, 40 μm, 45 μm; or between 15 and 35 μm, 20 and 40 μm, or 25 and 45 μm. The thickness of the tribological coating 126 applied to the first half 134 of the piston ring 110 varies from 270° towards 360° and from 90° towards 0° so that the ends 131, 132 of the piston ring 110 may have an overall thickness up to two times greater than the thickness of the adjacent portions of the ends 131, 132, i.e. out of the tips of the piston ring 110, the thickness of the ends 131, 132 ranging from 20 μm up to a maximum of 40 μm, or ranging from 10 μm up to a maximum of 80 μm. As a result, the tribological coating may be thickest adjacent the tips of the piston ring, while the same may be thinnest radially opposite the tips of the piston ring.

The tribological coating 126 may be formed on the exterior surface of the annular body 112 via any suitable deposition technique. For example, the tribological coating 126 may be formed on the exterior surface of the annular body 112 by physical vapor deposition (PVD) (e.g., cathodic arc or sputtering), chemical vapor deposition, vacuum deposition, or sputter deposition.

In one form, the tribological coating 126 may be formed on the exterior surface of the annular body 112 by a cathodic arc physical vapor deposition process that includes: (i) positioning the annular body 112 in a deposition chamber including an anode and at least one solid cathode source material; (ii) evacuating the deposition chamber; (iii) introducing a process gas into the deposition chamber; (iv) striking and maintaining an electric arc between a surface of the cathode source material and the anode such that portions of the cathode source material are vaporized; and (v) depositing the vaporized cathode source material on the exterior surface of the annular body 112.

The solid cathode source material may comprise pure elemental chromium (Cr) and the process gas may comprise a reactive nitrogen-containing gas. In such case, the vaporized chromium may react with nitrogen gas in the deposition chamber to form compounds of chromium nitride, which may be deposited on the exterior surface of the annular body 112 to form the tribological coating 126. The operating pressure within the deposition chamber during the deposition process may be in the range of 0-0.1 mbar and may be controlled by suitable adjustment to the flow rate of an inert gas (e.g., argon (Ar)) and/or the flow rate of nitrogen gas that is introduced into the deposition chamber as a constituent of the reactive nitrogen-containing gas. A negative voltage in the range of 0 volts to −150 volts (referred to as a bias voltage) may be applied to the annular body 112 during the deposition process to help accelerate the positively charged ions from the solid cathode source material to the exterior surface of the annular body 112. The duration of the deposition process may be controlled or adjusted to achieve a tribological coating 126 having a desired thickness. In one form, the deposition process may be performed at a deposition rate of 2-4 μm per hour and for a duration of 6-24 hours.

Various process parameters may be varied or modified partway through the deposition process to achieve the dual layer structure of the tribological coating 126. For example, the base layer 128 may be formed during a first stage of the deposition process. Then, after deposition of the base layer 128, certain process parameters may be changed to initiate a second stage of the deposition process wherein the top layer 130 is formed directly on and over the base layer 128. Deposition of the top layer 130 and the base layer 128 of the tribological coating 126 may be performed by modifying certain process parameters partway through the cathodic arc physical deposition process, without having to purchase additional manufacturing equipment and without having to extend the duration of the overall piston ring 110 manufacturing process. In one form, the first stage of the deposition process may be performed at a first operating pressure and the second stage of the deposition process may be performed at a second operating pressure greater than the first operating pressure. For example, the operating pressure of the nitrogen may be adjusted and increased during the deposition process to achieve a desire characteristic in both the base and top layers 128, 130. In one specific example, the operating pressure during the first stage of the deposition process may be about 0.03 mbar, and the operating pressure during the second stage of the deposition process may be about 0.05 mbar. Increasing the operating pressure during the second stage of the deposition process may increase the porosity and also may decrease the hardness of the chromium nitride material that is being deposited on the external surface of the annular body 112. Increasing the operating pressure during the second stage of the deposition process may result in the emission of relatively large droplets from the cathode source material, which may be deposited on the exterior surface of the annular body 112 over the base layer 128 and may modify the size of the particles or grains formed within the top layer 130, providing a combined characteristic of lower hardness and increased porosity.

A bias voltage may be applied to the annular body 112 during the first stage of the deposition process, but may not be applied to the annular body 112 during the second stage of the deposition process. In one specific example, a bias voltage of about 50 volts may be applied to the annular body 112 during the first stage of the deposition process. Applying a bias voltage to the annular body 112 during the first stage of the deposition process (but not the second stage) may result in the formation of a relatively hard base layer 128 and a relatively soft top layer 130. In another example, a bias voltage may be applied to the annular body 112 during both the first and second stages of the deposition process. In such case, the bias voltage applied to the annular body 112 during the first stage of the deposition process may be different from the bias voltage applied to the annular body 112 during the second stage of the deposition process. Changing the bias voltage between first and second stages of the deposition process may allow the top layer 130 to be formed with lower hardness and increased porosity, as compared to that of the base layer 128.

In addition to operating pressure and bias voltage, one or more other process parameters may be modified or changed partway through the deposition process to differentiate the chemical and/or mechanical properties of the top layer 130 and the base layer 128 and thereby improve the short-term and/or long-term performance of the piston ring 110. Some examples of additional process parameters that may be modified during the deposition may include any of the various process parameters including arc current, process temperature, and process time.

In the second preferred embodiment, the tribological coating 126 may be formed on the outer circumferential surface 120 of the annular body 112 by a cathodic arc physical vapor deposition (PVD) process of three subsequent steps, including: i) a first step which comprises the deposition of the base layer 128 on the entire outer circumferential surface 120 of the piston ring 110 and provides substantially uniform thickness ranging from 6 μm up to a maximum of 30 μm; ii) a second step which comprises the deposition of the base layer 128 only on the first half 134 of the outer circumferential surface 120 of the piston ring 110 and provides variable thickness from 270° towards 360° and from 90° towards 0° so that the ends 131, 132 of the piston ring 110 have its thickness ranging from 20 μm up to a maximum of 40 μm, or ranging from 10 μm up to a maximum of 80 μm; iii) a third step which comprises the deposition of the top layer 130 on the entire outer circumferential surface 120 of the piston ring 110 and provides substantially uniform thickness ranging from 2 μm up to a maximum of 20 μm.

In the third preferred embodiment, the tribological coating 126 may be formed on the outer circumferential surface 120 of the annular body 112 by a cathodic arc physical vapor deposition (PVD) process of three subsequent steps, including: i) a first step which comprises the deposition of the base layer 128 on the entire outer circumferential surface 120 of the piston ring 110 and provides substantially uniform thickness ranging from 10 μm up to a maximum of 30 μm; ii) a second step which comprises the deposition of the intermediate layer 129 only on the first half 134 of the outer circumferential surface 120 of the piston ring 110 and provides variable thickness from 270° towards 360° and from 90° towards 0° so that the ends 131, 132 of the piston ring 110 have its thickness ranging from 20 μm up to a maximum of 40 μm, or ranging from 10 μm up to a maximum of 80 μm; iii) a third step which comprises the deposition of the top layer 130 on the entire outer circumferential surface 120 of the piston ring 110 and provides substantially uniform thickness of at least 5 μm.

Still in the third preferred embodiment, the tribological coating 126 may be provided by a PVD process of four subsequent steps, including: i) a first step which comprises the deposition of the base layer 128 on the entire outer circumferential surface 120 of the piston ring 110 and provides substantially uniform thickness ranging from 10 μm up to a maximum of 30 μm; ii) a optional second step which comprises the deposition of the intermediate layer 129 on the entire outer circumferential surface 120 of the piston ring 110 and provides substantially uniform thickness up to a maximum of 10 μm; iii) a third step which comprises the deposition of the intermediate layer 129 only on the first half 134 of the outer circumferential surface 120 of the piston ring 110 and provides variable thickness from 270° towards 360° and from 90° towards 0° so that the ends 131, 132 of the piston ring 110 have its thickness ranging from 20 μm up to a maximum of 40 μm, or ranging from 10 μm up to a maximum of 80 μm; iv) a fourth step which comprises the deposition of the top layer 130 on the entire outer circumferential surface 120 of the piston ring 110 and provides substantially uniform thickness of at least 5 μm.

After deposition of the tribological coating 126, the surface of the top layer 130 may have a contour that exhibits a plurality of valleys and peaks. In such case, the outer circumferential surface of the piston ring 110 may be ground and lapped to transform the peaks into relatively flat ridges or plateaus, which may help prevent scuffing of the inner wall of the cylinder 12 during the running-in phase.

Figure 4:
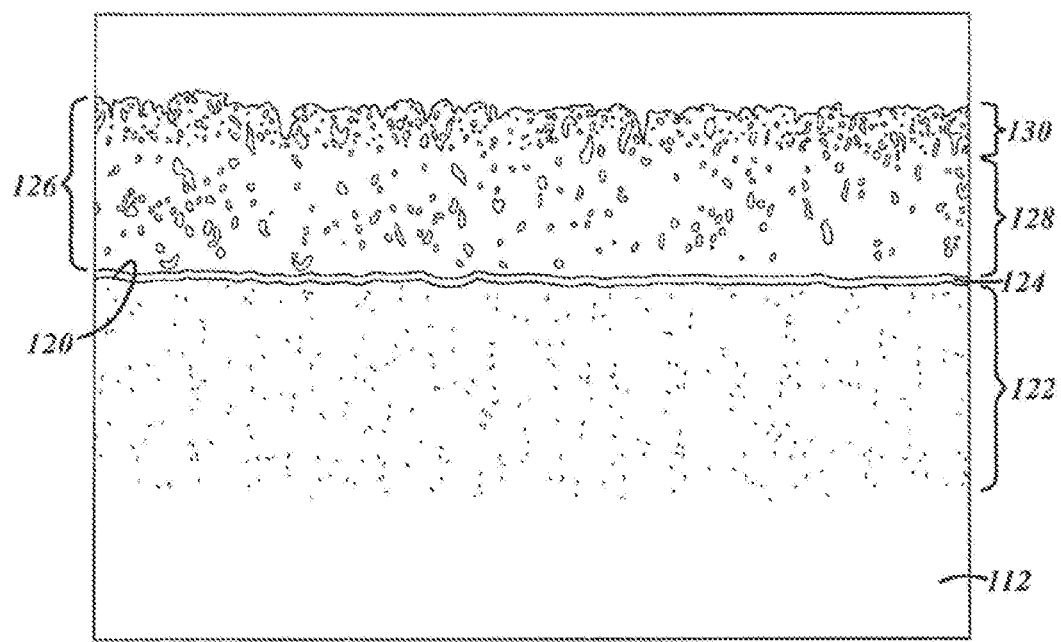
FIG. 4 is a schematic cross-sectional view of a portion of a contact surface of a piston ring.

FIG. 4 is a schematic cross-sectional view of a portion of the piston ring 110 illustrating the morphology of the diffusion nitrided layer 122, the intermediate coating 124, and the tribological coating 126 formed on and over the outer circumferential surface 120 of the annular body 112 of the piston ring 110 at 500 times magnification. The tribological coating illustrated in FIG. 4 may be produced using a cathodic arc physical vapor deposition process. As shown, a gradual transition in the microstructure of the tribological coating 126 may take place between the base layer 128 and the overlying top layer 130 as a result of a step-wise modification of the deposition process parameters partway through the deposition process.

It is to be understood that the foregoing is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A piston ring comprising:
   a body made of a ferrous material and having an outer circumferential surface;
   the body being a split annular body having two ends and provided with an open-ended portion between the two ends which fits into an annular groove formed in an outer circumference of a piston of a reciprocating engine, the region of the open-ended portion being defined by two ends which form the tips of the piston ring, the center of the open-ended portion being defined as a zero-degree (0°) angle and a 360° angle; and
   a tribological coating overlying the outer circumferential surface of the body that includes a base layer, an intermediate layer directly overlying the base layer, and a top layer directly overlying the intermediate layer,
   wherein:
   the base layer includes one of a chromium nitride-based material and a hydrogen-free diamond-like carbon-based material;
   the top layer includes one of a chromium nitride-based material and a hydrogen-free diamond-like carbon-based material, the top layer is a uniform thickness and has a relatively high porosity and a relatively low Vickers hardness, as compared to the porosity and Vickers hardness of the base layer, and
   the intermediate layer is provided with varying thickness such that its thickness increases gradually from 90° towards 0° in a first radial direction of the piston ring and from 270° towards 360° in a second radial direction of the piston ring reaching a maximum value in the region of the ends of the piston ring open-ended portion.

2. The piston ring set forth in claim 1, wherein the top layer has a Vickers hardness in the range of 800-1200 HV.

3. The piston ring set forth in claim 1, wherein the base layer is the chromium nitride-based material and has a Vickers hardness in the range of 1200 HV to 1600 HV.

4. The piston ring set forth in claim 1, wherein the intermediate layer includes a chromium oxynitride-based material which has a Vickers hardness in the range of 1600 HV to 2000 HV.

5. The piston ring set forth in claim 1, wherein the intermediate layer includes a transition metal nitride-based material, the transition metal being selected from the group consisting of titanium, zirconium, vanadium, niobium, chromium, molybdenum, tungsten, and combinations thereof, and wherein the base layer has a Vickers hardness in the range of 1300 HV to 1700 HV.

6. The piston ring set forth in claim 1, wherein the intermediate layer includes a chromium carbon-nitride-based material which has a Vickers hardness in the range of 1800 HV to 2200 HV.

7. The piston ring set forth in claim 1, wherein the top layer has a thickness of at least 5 μm and the base layer has a thickness in the range of 10-30 μm.

8. The piston ring set forth in claim 1, further including a diffusion nitride layer formed on the outer circumferential surface of the body and extending at a radial depth therein.

9. The piston ring set forth in claim 1, wherein the top layer and the base layer are of the same chemical composition having the top layer with the relatively low Vickers hardness as compared to the Vickers hardness of the base layer, and having the top layer with the relatively high porosity as compared to the porosity of the base layer.

10. The piston ring set forth in claim 1, wherein the base layer is the hydrogen-free diamond-like carbon-based material.

11. The piston ring set forth in claim 10, wherein the top layer is the chromium nitride-based material.

12. The piston ring as set forth in claim 1, wherein the top layer is a ceramic fabricated by a physical-vapor deposition process.

13. The piston ring as set forth in claim 1, wherein the tribological coating directly overlies the outer circumferential surface of the body.

14. The piston ring as set forth in claim 1, further comprising an intermediate coating between the tribological coating and the outer circumferential surface of the body to improve adhesion of the tribological coating to the outer circumferential surface of the body.

15. The piston ring as set forth in claim 14, wherein the intermediate coating includes one of chromium, nickel, cobalt, titanium, and vanadium.

16. A piston ring comprising:
a ferrous body made having an outer circumferential surface;
the ferrous body being a split annular body having two ends and provided with an open-ended portion between the two ends which fits into an annular groove formed in an outer circumference of a piston of a reciprocating engine, the region of the open-ended portion being defined by two ends which form the tips of the piston ring, the center of the open-ended portion being defined as a zero-degree (0°) angle and a 360° angle;
a tribological coating overlying the outer circumferential surface of the ferrous body that includes a base layer, an intermediate layer directly overlying the base layer, and a top layer directly overlying the intermediate layer; and
an intermediate coating between the tribological coating and the outer circumferential surface of the ferrous body to improve adhesion of the tribological coating to the outer circumferential surface of the ferrous body,
wherein:
the base layer includes one of a chromium nitride-based material and a hydrogen-free diamond-like carbon-based material;
the top layer is a uniform thickness and includes one of a chromium nitride-based material and a hydrogen-free diamond-like carbon-based material, the top layer has a relatively high porosity and a relatively low Vickers hardness, as compared to the porosity and Vickers hardness of the base layer; and
the intermediate layer is provided with varying thickness such that its thickness increases gradually from 90° towards 0° in a first radial direction of the piston ring and from 270° towards 360° in a second radial direction of the piston ring reaching a maximum value in the region of the ends of the piston ring open-ended portion.

17. The piston ring set forth in claim 16, further comprising a diffusion nitride layer formed on the outer circumferential surface of the ferrous body and extending at a radial depth therein.

18. The piston ring set forth in claim 16, wherein the top layer and the base layer are of the same chemical composition having the top layer with the relatively low Vickers hardness as compared to the Vickers hardness of the base layer, and having the top layer with the relatively high porosity as compared to the porosity of the base layer.

19. The piston ring set forth in claim 16, wherein the base layer is the hydrogen-free diamond-like carbon-based material.

20. The piston ring set forth in claim 19, wherein the top layer is the chromium nitride-based material.

21. The piston ring as set forth in claim 16, wherein the top layer is a ceramic fabricated by a physical-vapor deposition process.

* * * * *